United States Patent
Gesset

(10) Patent No.: US 9,736,414 B2
(45) Date of Patent: Aug. 15, 2017

(54) RAMP-TYPE ANALOGUE-DIGITAL CONVERSION, WITH MULTIPLE CONVERSIONS OR SINGLE CONVERSION, DEPENDING ON THE LIGHT LEVEL RECEIVED BY A PIXEL

(71) Applicant: E2V SEMICONDUCTORS, Saint Egreve (FR)

(72) Inventor: Stéphane Gesset, Saint-Laurent-du-Pont (FR)

(73) Assignee: E2V SEMICONDUCTORS, Saint Egreve (FR)

(*) Notice: Subject to any disclaimer, the term of this patent is extended or adjusted under 35 U.S.C. 154(b) by 0 days.

(21) Appl. No.: 15/028,446

(22) PCT Filed: Oct. 9, 2014

(86) PCT No.: PCT/EP2014/071683
§ 371 (c)(1),
(2) Date: Apr. 11, 2016

(87) PCT Pub. No.: WO2015/055509
PCT Pub. Date: Apr. 23, 2015

(65) Prior Publication Data
US 2016/0255293 A1   Sep. 1, 2016

(30) Foreign Application Priority Data
Oct. 14, 2013  (FR) .................................... 13 59940

(51) Int. Cl.
*H04N 5/378*     (2011.01)
*H04N 5/363*     (2011.01)
(Continued)

(52) U.S. Cl.
CPC .............. *H04N 5/378* (2013.01); *H03M 1/56* (2013.01); *H04N 5/355* (2013.01); *H04N 5/357* (2013.01);
(Continued)

(58) Field of Classification Search
CPC ...... H04N 5/3355; H04N 5/357; H04N 5/361; H04N 5/363; H04N 5/365; H04N 5/3651;
(Continued)

(56) References Cited

U.S. PATENT DOCUMENTS 6,243,034 B1 * 6/2001  Regier .................. H03M 1/145
                                                  341/155
8,031,241 B2 * 10/2011  Maeda ................... H04N 5/351
                                                  348/241
(Continued)

FOREIGN PATENT DOCUMENTS

EP        1655840 A1    5/2006

OTHER PUBLICATIONS

International Search Report and Written Opinion for PCT/EP2014/071683, dated Nov. 10, 2014.

*Primary Examiner* — Lin Ye
*Assistant Examiner* — Chriss Yoder, III
(74) *Attorney, Agent, or Firm* — Hauptman Ham, LLP; Sean A. Passino

(57) ABSTRACT

In a matrix image sensor, a method of reading a pixel of a column allows two modes of analogue-digital conversion of the voltage level provided by the column: a first mode in which are carried out a single analogue-digital conversion in a nominal conversion time window $F_{CONV}$, of nominal duration $d_n$ and a counting which starts with a ramp of nominal duration $d_n$ and stops upon the toggling of the output $S_{CMP}$ of the comparator; and a second mode which provides for multiple conversions by comparison with a
(Continued)

ramp of reduced duration $d_r$, in the same nominal conversion time window. The selection of the mode of conversion to be applied is based on the observation of the state of the output $S_{CMP}$ of the comparator after a predetermined duration after the instant $t_i$ of ramp start: if the output has toggled, the useful level to be converted represents a low light level to which the second mode with multiple conversions will be applied; if the output has not toggled, the useful level to be converted represents a high light level and the first, conventional, mode with single conversion will be applied. The invention makes it possible to improve the signal-to-noise ratio at the output of the sensor, for low light levels, by decreasing the amount of the Gaussian noise due to the circuits of the conversion chain.

8 Claims, 7 Drawing Sheets

(51) Int. Cl.
    *H04N 5/357*    (2011.01)
    *H03M 1/56*     (2006.01)
    *H04N 5/355*    (2011.01)
    *H04N 5/3745*   (2011.01)
    *H03M 1/14*     (2006.01)

(52) U.S. Cl.
    CPC ......... *H04N 5/363* (2013.01); *H04N 5/37455* (2013.01); *H03M 1/14* (2013.01)

(58) Field of Classification Search
    CPC .. H04N 5/3745; H04N 5/37455; H04N 5/378; H03M 1/126; H03M 1/1265; H03M 1/127; H03M 1/1275; H03M 1/14; H03M 1/145; H03M 1/38
    See application file for complete search history.

(56) References Cited

U.S. PATENT DOCUMENTS

| 2011/0242377 A1 | 10/2011 | Korekado et al. | |
| 2012/0006974 A1* | 1/2012 | Egawa | H04N 5/3742 250/208.1 |
| 2012/0008028 A1* | 1/2012 | Egawa | H04N 5/378 348/300 |

\* cited by examiner

RAMP-TYPE ANALOGUE-DIGITAL CONVERSION, WITH MULTIPLE CONVERSIONS OR SINGLE CONVERSION, DEPENDING ON THE LIGHT LEVEL RECEIVED BY A PIXEL

FIELD

The invention relates to a method of reading the pixels of image sensors, and more particularly image sensors with large dynamic range, intended to gather images both at low luminance level and at high luminance level.

BACKGROUND

An image sensor comprises a matrix of pixels organized into rows and columns. The pixels of one and the same column are linked to a column conductor which is itself linked to a reading circuit, to convert into digital the voltage level applied to the column conductor by a pixel selected for reading. This voltage level represents the light level received by the pixel. This conversion is carried out by a ramp-type analogue-digital converter, which comprises a comparator for comparing the voltage level to be converted with a linear voltage ramp, and a counter which counts at high frequency from the instant the ramp starts until the comparator toggles. The content of the counter at the instant of toggling represents a numerical value of the voltage level to be converted.

The pixel mainly comprises a photodiode and MOS transistors, for example four transistors, which make it possible to drive the reading of the charge generated by the light in the photodiode. The pixels with four transistors operate by transferring charge from the photodiode to a capacitive storage node previously initialized to a reinitialization potential; the reading of the pixel in general comprises the carrying over onto the column conductor of the reinitialization potential and then of the potential of the storage node representative of the light level received by the pixel.

In a known manner, to circumvent the noise associated with the capacitive storage node of the pixel, which is correlated noise that is encountered equally well with regard to the reinitialization level of the storage node as with regard to the useful level after transfer of the charge received, it is possible to perform an analogue-digital conversion of each of the two levels, reinitialization level and useful level, and a subtraction is performed between the two numerical values, thus eliminating this correlated-noise component. It is also possible to do an analogue subtraction of the voltages before converting the difference. In this case, two sampling capacitors are used to sample the electrical signal provided by the column, one after reinitialization and the other after charge transfer, before performing a differential conversion.

The reading circuit is dimensioned as a function of the dynamic range of the sensor, that is to say of the span of illuminations that it is desired to measure. Notably the duration of the ramp is determined so as to allow the conversion of the highest illumination level that it is desired to measure, having regard to the counting frequency, the number of bits of the counter, and the desired conversion rate.

The dynamic range of these image sensors is in practice limited towards the low luminance levels, by the various sources of noise of the conversion chain, comprising the transistor mounted as follower in the pixel, so as to copy the potential of the storage node onto the column conductor, the current source common to all the columns, the large-gain amplifier forming the comparator etc. This chain noise is completely random and independent of the level of the signal to be measured. It constitutes an impediment to the ability to increase the dynamic range of sensors towards low illumination levels.

The invention is more particularly concerned with reading circuits which directly perform an analogue-digital conversion of each of the two voltage levels provided by the column, and the subtraction between the two numerical values obtained. In this context in fact, theoretically it is known how to reduce in a root of n ratio, the amount of Gaussian noise present in a signal, by performing n conversions of this signal and by averaging these n conversions.

But performing n conversions multiplies the time necessary for reading a pixel, which is fixed mainly by the nominal duration of the ramp, determined so as to obtain a wide dynamic range and good resolution for these sensors.

SUMMARY

To solve this problem, the invention proposes to determine, in the phase of analogue-digital conversion of the voltage level provided by the column, whether this level represents a low or a high illumination level, so as, in the case of a low illumination level, to carry out n conversions and to average them, in the time normally allocated for a single conversion, by using a ramp of reduced duration for each of the n conversions.

Consequently, the invention proposes a method of reading a pixel in a matrix image sensor, the pixel providing on a column conductor a voltage level representing a light level received by the pixel, and the method of reading comprising an analogue-digital conversion by means of a ramp-type converter comprising a comparison of the voltage level received from the column conductor with an analogue voltage ramp by means of a comparator, and a counting of clock pulses between an instant of ramp start and an instant of toggling of the output of the comparator.

According to the invention, the method of reading comprises a decision phase in which the toggling of the output of the comparator is detected after a predetermined time after the instant of ramp start, so as to discriminate between a high light level, if the output has not toggled, or a low light level, if the output has toggled, and to convert the voltage level in accordance with respectively a first or a second mode of conversion where the first mode of conversion comprises a single counting by the counter in the course of a nominal conversion time window with the aid of a ramp of nominal duration allowing the conversion of a high light level, the second mode of conversion comprises the establishment of n successive ramps of reduced duration over the duration of the nominal conversion time window, with for each ramp, a counting by the counter between the start of the ramp and the toggling of the output of the comparator, and a summation of the n counting results, where n is an integer greater than 1.

The decision phase can be carried out before the start of the nominal conversion time window.

But it can also be carried out at the start of this nominal conversion time window. It then starts with the voltage ramp of nominal duration, and should the output of the comparator toggle before the end of the decision phase, the voltage ramp of nominal duration is interrupted after the reduced duration and constitutes the first of the n successive ramps. In this context, if there is a counter specific to each column of the matrix of pixels, it is possible to carry out directly the summation of the n countings of the second mode of conversion, by providing for the counting to commence, after resetting to zero of the counter, with the first of the n successive ramps of reduced duration and to resume without resetting to zero with each of the n−1 following ramps of reduced duration. At the end of the nominal conversion time window, the counter provides as output the result of the summation by accumulation of the n countings.

When the method of reading comprises a first conversion of a reinitialization level, a second conversion of a useful level representative of the light level received by the pixel and a subtraction of the results of the two conversions, making it possible to remove correlated noise related to the capacitor of the storage node, the reinitialization level is converted according to the second mode of conversion.

According to the invention, in the case of a useful level corresponding to a high light level, the result of the conversion of the reinitialization level which is carried out according to the second mode, is then divided by n before subtraction of the result of the conversion of the useful level.

In the case where the decision phase is carried out before the start of the nominal conversion time window, it is possible to use an up-counter/down-counter specific to each column of the matrix of pixels, to carry out directly in this up-counter/down-counter the subtraction of the results of the two conversions (useful level-reinitialization level): according to the result of the decision phase, it is possible to change the counting pace of the counter from 1 to n, before the second conversion, and the associated countdown, commences.

More precisely, for the first conversion, of the reinitialization level: the counter is configured in counting mode with a 1 by 1 counting; and then for the second conversion, of the useful level, the counter is configured in countdown mode, without resetting to zero, with a 1 by 1 or n by n counting pace as a function of the result of the decision phase for this second conversion.

In practice, provision is made for the voltage ramps to all have one and the same starting level equal to the voltage level of the column conductor during a phase of reinitializing the pixel.

The invention also relates to a corresponding matrix image sensor.

BRIEF DESCRIPTION OF THE DRAWINGS

Other characteristics and advantages of the invention are given in the following detailed description, given by way of nonlimiting indication, and with reference to the appended drawings in which.

DETAILED DESCRIPTION

Figure 1:
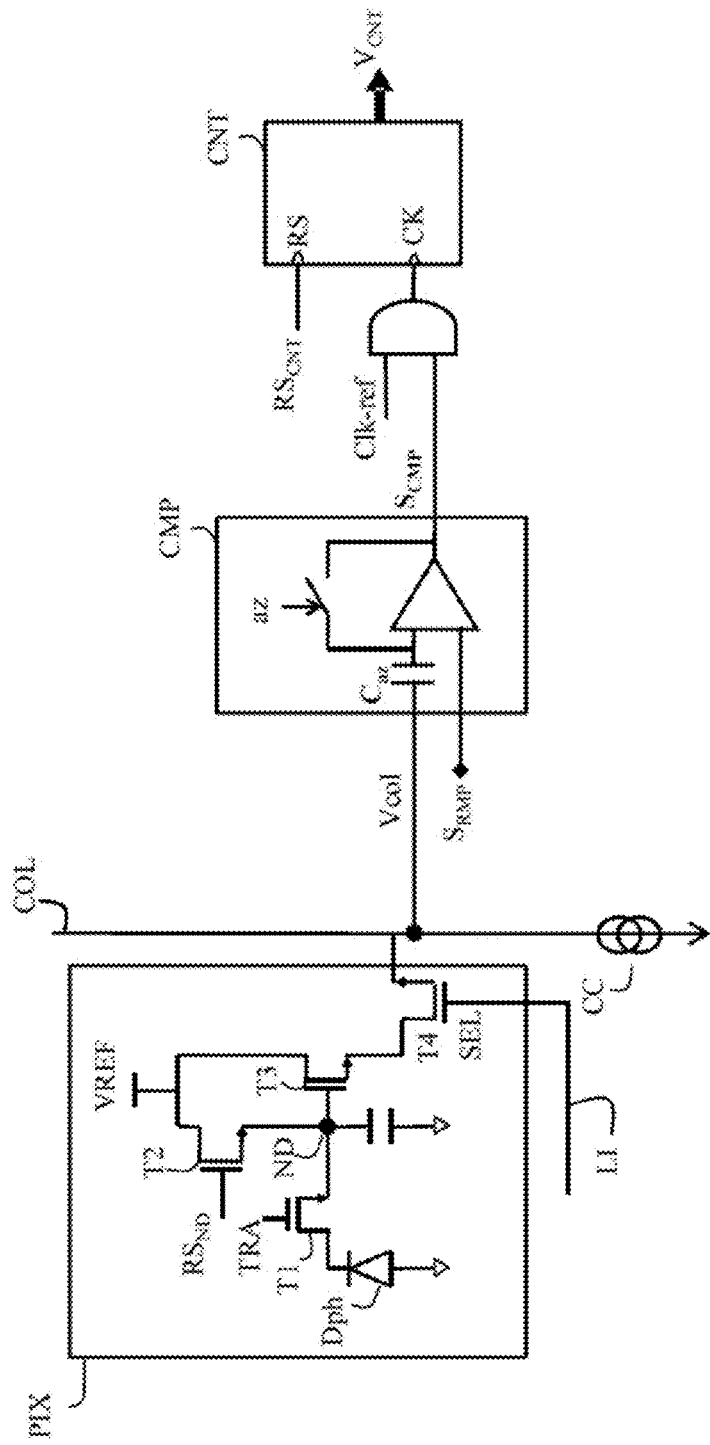
FIG. 1 illustrates a conventional structure of pixel of a matrix image sensor and of following associated reading circuit allowing a method of reading according to the prior art.
Figure 2:
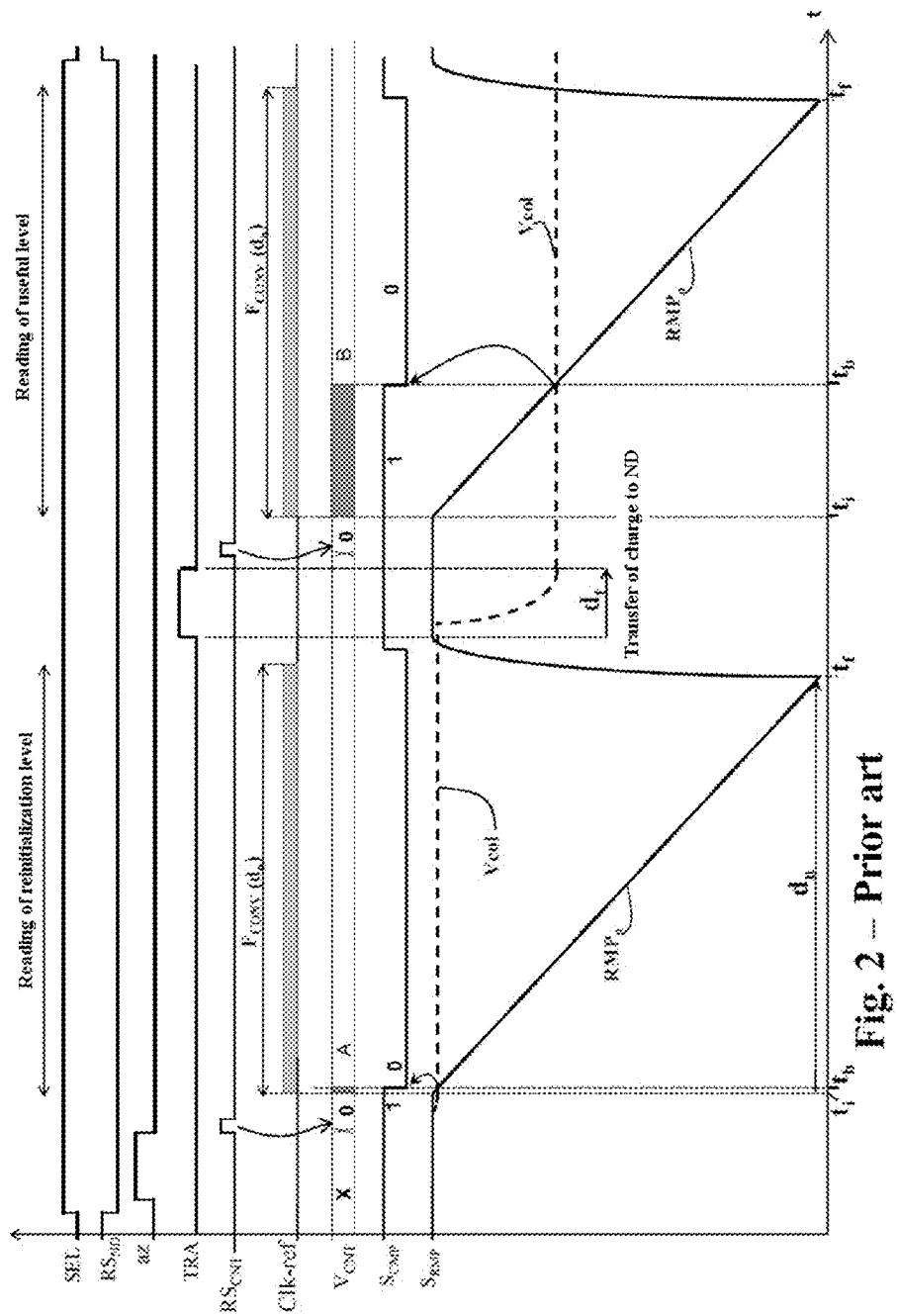
FIG. 2 is a corresponding timechart of the various signals of the reading circuit.

FIG. 1 illustrates a conventional structure of a pixel linked to a column conductor of the matrix of pixels, and a circuit for reading this pixel according to the prior art, carrying out an analogue-digital conversion of the voltage level provided by the column conductor and FIG. 2 represents a timechart of the corresponding signals.

The pixel PIX comprises a photodiode $D_{ph}$, a capacitive storage node ND, depicted by a point to which is linked a capacitor, a transistor for charge transfer T1 between the cathode of the photodiode and the storage node, a transistor T2 for reinitializing the potential of the storage node, a follower transistor T3 and a row selection transistor T4.

The transistor T1 is controlled by a transfer signal TRA. The transistor T2 has its drain linked to a reference potential denoted VREF which may be the logic supply voltage. It is controlled by a signal $RS_{ND}$ controlling the reinitialization of the storage node ND. The follower transistor T3 has its drain linked to a fixed potential, in the example the potential VREF. Its source is linked to the row selection transistor T4 and its gate is linked to the storage node ND. The row selection transistor T4 has its gate linked to a row conductor LI which links the gates of all the row selection transistors of one and the same row of pixels of the matrix. The drain of the transistor T4 is linked to the source of the transistor T3 and its source is linked to the column COL conductor common to all the pixels of one and the same column of pixels.

The column conductor is linked to a reading circuit, at the foot of the column. It is also linked to a current source CC, generally by a transistor (not represented) which makes it possible to isolate the column conductor from the current source outside of the pixel reading phases. The current source is generally common to all the columns.

When the pixel is selected, the transistor T3 behaves as a voltage follower, transferring the potential of the storage node ND onto the column conductor.

The reading circuit makes it possible to provide a numerical value $V_{CNT}$ representing the voltage level Vcol transferred onto the column conductor. This value is placed in memory with the other values obtained for the other pixels, so as to be processed by circuits (not represented) for digital processing of these data. Preferably one firstly measures a voltage level after reinitialization of the storage node and then a voltage level after transfer into the node for storing the charge representing the illumination and the two measurements are differenced.

The reading circuit comprises an analogue-digital converter with a comparator CMP for comparing the voltage level Vcol to be converted with a linear voltage ramp $RMP_n$ and a counter CNT which counts at high frequency from an instant $t_i$ of start of the ramp until an instant $t_b$ of toggling of the output of the comparator. At this instant, the content $V_{CNT}$ of the counter represents a numerical value of the voltage level to be converted. This content is placed in memory and represents a value of illumination of the pixel.

In practice the content of the counter is initialized to zero before the start $t_i$ of the ramp and the commencement of the counting is synchronized with the ramp start.

The comparator is a differential amplifier with autozero with large gain, one input of which is linked to the column COL conductor, and whose other input receives a ramp signal, which provides a linear voltage ramp $RMP_n$ over a duration $d_n$. The ramp signal $S_{RMP}$ is provided by a linear ramp generator for example a generator using a capacitor charged by a constant current source. This could equally well be a counter followed by a digital-analogue converter which provides to first order a linear voltage ramp, even if it is done with small increments.

The ramp generator can be common to all the reading circuits, that is to say to all the columns of the matrix, synchronized, and activated in a nominal conversion time window, of duration $d_n$. The duration $d_n$ and the slope of the ramp $RMP_n$ are determined for a given sensor so as to allow the conversion of the highest illumination level that it is desired to measure, having regard to the counting frequency, the number of bits of the counter, and the desired conversion rate. The ramp voltage level at the instant $t_f$ of end of ramp corresponds to the highest illumination level that it is desired to measure.

The output $S_{CMP}$ of the comparator toggles when the voltages on its two inputs become equal in the course of the evolution of the ramp. The initial autozero phase makes it possible to compensate for the offset voltages ("shifts") of the comparators of the various columns.

Briefly, the method proceeds as follows:

The signal SEL which controls the gate of the transistor T4 of the pixel PIX, passes to the active level for the whole of the duration of the time reserved for the reading of the pixel.

The capacitive storage node ND of the pixel is reinitialized by applying a pulse $RS_{ND}$ to the transistor T2 to turn it on.

The column COL charges to the storage node reinitialization level, to within the threshold voltage of the follower transistor T3.

A phase of autozero of the comparator (signal az) is performed firstly.

After resetting to zero of the content $V_{CNT}$ of the counter ($RS_{-CNT}$), the nominal conversion time window $F_{CONV}$ for the first conversion starts. The counter counts at a clock frequency Clk-ref from the start (instant $t_i$) of the ramp $RMP_n$ until the toggling of the comparator at an instant $t_b$ which depends on the voltage level on the column conductor. Toggling stops the counting.

The content $V_{CNT}$ of the counter at the instant of toggling provides the numerical value A corresponding to the reinitialization level of the pixel storage node. This first value is placed in memory.

The end of the nominal conversion time window, which coincides with the instant $t_f$ of end of linear ramp $RMP_n$, marks the end of the reinitialization level reading phase.

The charge generated by the light in the photodiode is then transferred into the storage node (signal TRA). The content $V_{CNT}$ of the counter is reset to zero ($RS_{-CNT}$) and the nominal conversion time window $F_{CONV}$ for the second conversion starts, with a new linear ramp $RMP_n$.

The same steps are present as described in the reinitialization level reading phase: establishment of the ramp $RMP_n$, counting, toggling of the comparator, stopping of the counting, placing in memory of the content B of the counter. The numerical measurement of illumination is the difference B−A.

In this context, the invention proposes a method of reading which makes it possible to improve the dynamic range of the counter towards the low light levels, that is to say which makes it possible to improve the signal-to-noise ratio when the useful signal is weak, without increasing the conversion time and without overly increasing the reading circuit area.

According to the invention, two modes of conversion are provided, a first which corresponds to that previously described, with a single conversion in the nominal conversion time window and a counting which starts with the ramp and stops upon the toggling of the output of the comparator; and another mode which provides for multiple conversions by comparison with a ramp of reduced duration, in the same nominal conversion time window. The selection of the mode of conversion to be applied is based on the observation of the state of the output of the comparator after a predetermined duration after the instant of ramp start: if the output has toggled, the useful level to be converted represents a low light level to which the second mode with multiple conversions will be applied; if the output has not toggled, the useful level to be converted represents a high light level and the first, conventional, mode with single conversion will be applied.

To explain the method of reading according to the invention, we deal initially only with the reading of a voltage level Vcol on a column COL.

Figure 3:
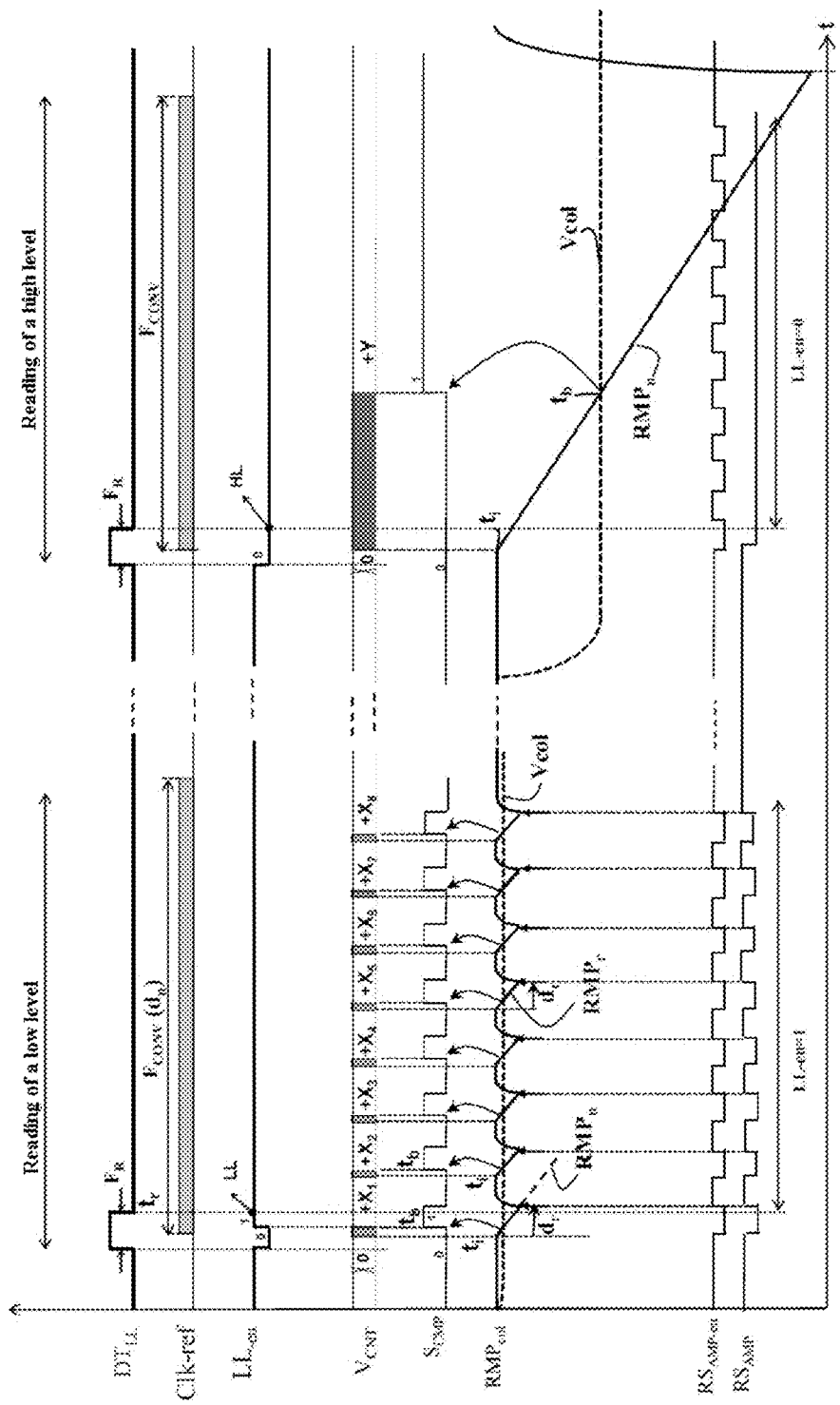
FIG. 3 represents a timechart of the reading signals for a pixel, according to a method of reading according to the invention using a first or a second mode of conversion according to the light level received by the pixel.

FIG. 3 illustrates timecharts corresponding, on the left, to the reading of a column voltage level representing a low light level; on the right, to the reading of a voltage level corresponding to a high light level.

These timecharts correspond to a method of reading according to the invention, in an implementation according to which the phase of deciding the mode of conversion to be applied is concomitant with the phase of analogue-digital conversion of the voltage level provided by the column. In this implementation, the decision of the mode of conversion to be applied is made at an instant $t_r$ after the instant $t_i$ of ramp start.

Each conversion comprises a comparison with a linear ramp and a counting which starts with an instant $t_i$ of start of the ramp. But according to the mode of conversion, with single conversion or with multiple conversions, the linear ramp is the ramp $RMP_n$ of nominal duration $d_n$, or a ramp $RMP_r$ of reduced duration $d_r$, allowing n conversions by comparison with this ramp $RMP_r$ over the duration $d_n$. In the example of the timechart of FIG. 3, we thus have on the left, a ramp signal $S_{RMP}$ which comprises n successive linear ramps $RMP_r$ over the duration $d_n$ of the nominal conversion time window $F_{CONV}$, when, on the right, we have a ramp signal $S_{RMP}$ which comprises only the linear ramp $RMP_n$, of nominal duration $d_n$, during the window $F_{CONV}$.

By comparison with the timechart of FIG. 2, that of FIG. 3 also highlights the addition of the decision phase according to the invention. This decision phase, at the start of the analogue-digital conversion, is manifested by the presence of a signal $DT_{LL}$ delimiting a decision time window $F_R$. The reading circuit stores the state of the output of the comparator at the end (instant $t_r$) of the decision window and provides from the end of the decision window a logic level $LL_{-en}$ indicating whether or not the comparator has toggled.

Thus in the example, if $LL_{-en}$ stores a "0" at the instant $t_r$, this implies that the output of the comparator has not toggled between $t_i$ and $t_r$. The useful level processed therefore represents a high light level HL. The comparison with the linear ramp $RMP_n$ continues, as does the counting, started at the instant until the instant $t_b$ of toggling of the output of the comparator, where $t_i < t_r < t_b$. At this instant $t_b$ the content $V_{CNT}$ of the counter contains a numerical value Y which is the result of the measurement. This is the first mode of conversion according to the invention, which corresponds to the conventional conversion described previously with reference to FIGS. 1 and 2 and which is represented on the right in FIG. 3.

But if $LL_{-en}$ stores a "1" at the instant $t_r$, this implies that the output of the comparator has toggled between $t_i$ and $t_r$. The useful level processed therefore represents a low light level LL. According to the invention, n conversions are then carried out over the duration $d_n$ of the nominal conversion time window $F_{CONV}$ together with a summation of the n results. Each of the n conversions consists of a comparison with a linear ramp $RMP_r$ of reduced duration $d_r$, and a counting which starts with the instant $t_i$ of ramp start and terminates at the instant of toggling $t_b$ of the output of the comparator, where $t_i < t_b \leq t_r$. This is the second mode of conversion according to the invention, and represented on the left in FIG. 3.

In practice the instant $t_r$ is such that a duration $d_r$ has elapsed since the instant $t_i$ of ramp start (which is here the instant of start of the conversion window $F_{CONV}$). Thus the duration $d_r$ calibrates the threshold of discrimination between a low level LL and a high level HL, and it dimensions the excursion of the ramps of reduced duration.

These ramps of reduced duration $d_r$ are advantageously obtained on the basis of the ramp $RMP_n$ of nominal duration $d_n$, by interrupting this ramp after the reduced duration $d_r$ so as to reinitialize it for the following conversion.

On completion of each of the n conversions with ramp of reduced duration, a corresponding counting value is obtained: $X_1, X_2, \ldots X_8$, in the example illustrated with n=8. The summation of these n values thereafter allows the digital processing circuit to manipulate an average value: in this average value, the amount of Gaussian random noise, related to the chain noise (follower, comparator etc.) is then appreciably lower, by a root of n factor, than if a single conversion had been performed over the nominal duration, according to the first mode of conversion.

In a practical implementation corresponding to the representation of FIG. 3, when there is a counter CNT per column, the results are accumulated in the register of the counter in tandem with the n conversions. On completion of the n conversions, the content $V_{CNT}$ of the counter is equal to the sum of the n values. It can be stored so as to be processed thereafter by a digital processing circuit DSP of the sensor. This accumulation in the counter is depicted by the sign + placed in front of each of the n counting values $X_1, X_2, \ldots X_8$.

Various processings are possible thereafter. The division by n can be carried out by the circuit DSP. Or else, the result of the n accumulations is stored after shifting by k positions, where $n=2^k$, in the register of the counter, thus performing the division. In the example where $n=8=2^3$, it suffices to shift the content of the counter by 3 positions to the right (least significant bits (LSB) side). In this case, the shifting of the result by k positions is activated when the signal $LL_{-en}$ is set to "1" and deactivated otherwise (with the conventions used $LL_{-en}=$"1": low level and $LL_{-en}=$"0": high level).

Figure 4:
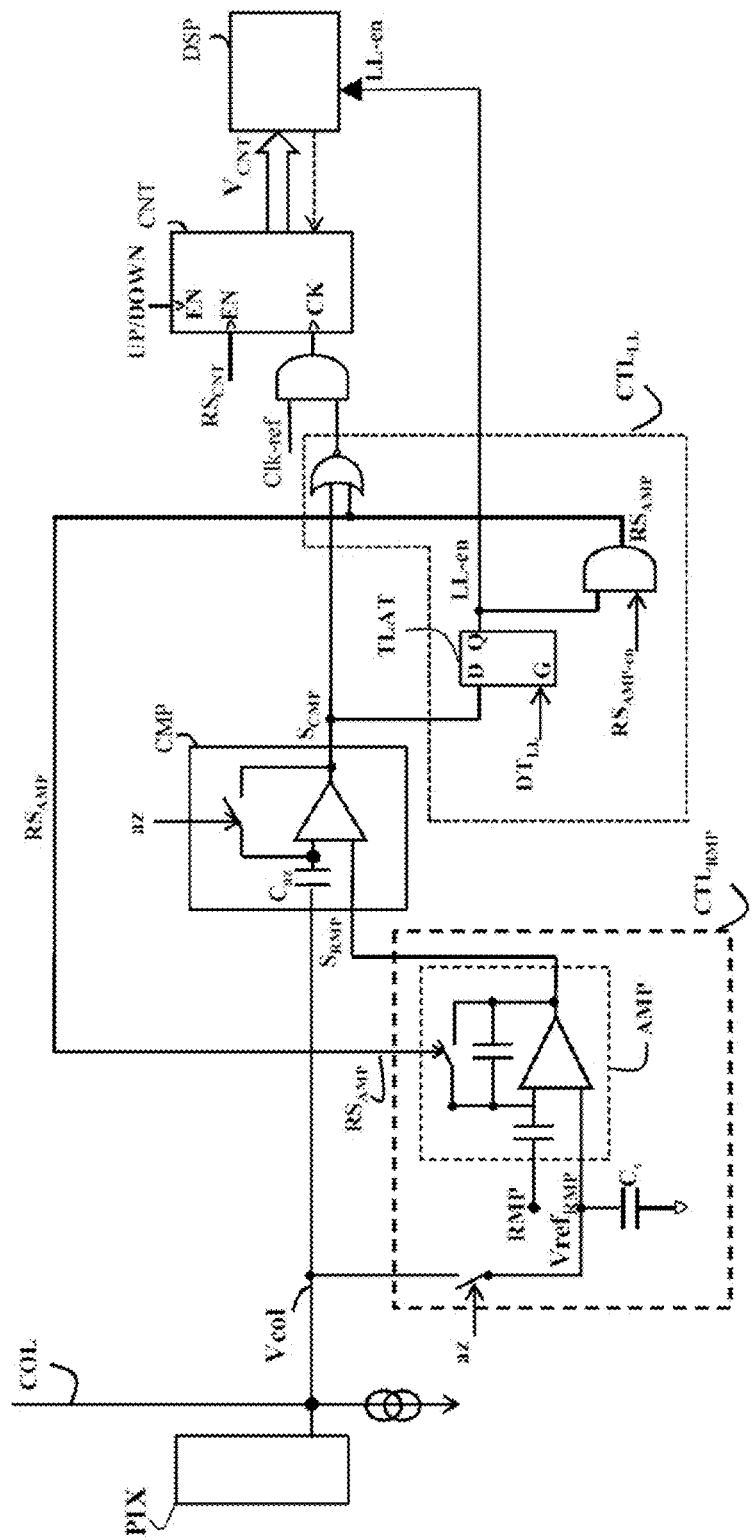
FIG. 4 illustrates an exemplary reading circuit making it possible to implement the method of reading according to the invention.

FIG. 4 represents a column reading circuit, able to implement a method of reading a pixel of this column which complies with the timechart of the signals of FIG. 3. This circuit comprises a comparator CMP, a counter CNT, and a ramp drive circuit $CTL_{RMP}$ and a logic circuit $CTL_{LL}$ making it possible to detect a low light level and to drive the second mode of conversion. The ramp drive circuit receives a linear voltage ramp, of positive slope, from a ramp generator common to all the columns.

The control elements and signals for this reading circuit which are identical to those of the circuit of the prior art presented in FIG. 1 bear the same references. These common elements are the comparator CMP, which receives as inputs the voltage Vcol provided by the column of the pixel, and a ramp signal $S_{RMP}$.

This ramp signal $S_{RMP}$ is delivered by the circuit $CTL_{RMP}$ which comprises an amplifier (inverter) with large gain and with autozero. The gain of the amplifier is determined so as to deliver the linear voltage ramp $RMP_n$ of nominal duration $d_n$ with the desired negative slope on the basis of the linear voltage ramp RMP applied to all the reading circuits. This large-gain amplifier receives on an input, a reference voltage $Vref_{RMP}$ which fixes the starting voltage level of the ramp signal $S_{RMP}$. It receives on the other input, a linear voltage ramp RMP of positive slope, through a capacitor. This ramp is provided by a generator, not represented, common to all the columns of the sensor and controlled in an appropriate manner so that a linear ramp $RMP_n$ of duration $d_n$ at the input of the comparator starts with each nominal conversion time window $F_{CONV}$.

The level $Vref_{RMP}$ is obtained in practice by sampling of the voltage level provided by the column after reinitialization of the pixel PIX. This makes it possible to render the conversion result independent of the variations of threshold voltages of the follower transistors of the pixels. The circuit $CTL_{RMP}$ thus comprises a capacitor $C_S$ for sampling the column voltage Vcol on the reference input of the amplifier AMP. This sampling capacitor is charged to the level of the column voltage Vcol after the reinitialization of the pixel PIX. In practice the comparator CMP autozero control signal az is used as sampling control signal.

The output of the amplifier AMP is initialized to this reference level $Vref_{RMP}$ by looping its output back to the ramp input RMP. This initialization is controlled by a signal $RS_{AMP}$ applied as amplifier autozero. At the end of this initialization, the negative-slope linear ramp $RMP_n$ starts from this reference level.

This initialization of the output of the amplifier AMP is carried out at each new window $F_{CONV}$. In the exemplary implementation of the invention, in which the nominal ramp $RMP_n$ is used to produce the series of ramps of reduced duration $RMP_r$, this initialization is also carried out, periodically, n times, over the duration of the window $F_{CONV}$, when the signal $LL_{-en}$ for detecting a low level is active. In this case, the counting is also recommenced periodically, from the previous counting value, and stopped upon each toggling of the output of the comparator.

These counter reinitialization and drive functions in conjunction with the decision function, to ensure the conversion according to the first mode or the second mode of conversion, with the same reading circuit, are carried out by a logic circuit denoted $CTL_{LL}$ in FIG. 4.

The decision function is carried out by a flip-flop TLAT, which receives as data input D, the comparator output signal $S_{CMP}$ and as drive input G, a signal $DEC_{LL}$, common to all the columns, and which delimits the decision window $F_R$. The memory output Q of the flip-flop provides the signal $LL_{-en}$, which copies the output signal $S_{CMP}$ during the window $F_R$ and preserves it in memory on the basis of the falling edge of the signal $DT_{LL}$ marking the end of the window $F_R$.

The ramp drive circuit $CTL_{RMP}$ amplifier reinitialization function is ensured by logic gates for transmitting or otherwise a reinitialization control signal $RS_{AMP-en}$, as a function of the state of the signal $LL_{-en}$. In the example, with the level conventions indicated in FIG. 3, an AND gate carries out the desired function, so as to provide the signal $RS_{AMP}$, copy the signal $RS_{AMP-en}$ only if the signal $LL_{-en}$ is at its active level signalling a conversion of a low level. Thus in the example, the output of the amplifier AMP is reinitialized by looping back to $Vref_{AMP}$ whenever the signals $RS_{Amp-en}$ and $LL_{-en}$ are at the logic level "1" at the same time.

The Clk-ref signal transmission/disabling function activated in case of low level detection LL, is ensured by a NOR gate between the signal $S_{CMP}$ and the signal $RS_{AMP}$, whose output is applied as input to the AND gate which makes it possible to enable or disable the transmission of the clock signal Clk-ref on the clock input CK of the counter.

Thus the method of reading according to the invention can be easily implemented, by means of sequential-logic circuits, through customary design techniques. These circuits may vary according to the active logic levels employed for the various control signals.

In a practical example, corresponding to the timecharts represented, the ramp signal $S_{RMP}$ reinitialization time, that is to say the duration of the high levels of the pulses of the signals $RS_{Amp-en}$ and $RS_{AMP}$, is chosen equal to the duration $d_r$ of the ramps $RMP_r$.

If a 10-bit counter making it possible to count 1024 clock ticks is used, it is possible to calibrate the reduced duration so as to be able to carry out n=4 conversions: the duration $d_r$ corresponds to the time required to count 128 clock ticks; and the duration corresponding to the following 128 clock ticks is used to reinitialize the amplifier of the ramp drive circuit (counting being disabled during this time). At the end of the window $F_{CONV}$, the sum of 4 successive conversions has been carried out in the counter. By shifting the result provided by the counter by two bits to the left, the average value of these 4 conversions is obtained (division by 4). If an 11-bit counter is taken, it will be possible by the same principle to carry out 8 conversions, and the average value will be obtained by shifting by 3 bits to the left (division by 8). If a 14-bit counter is taken, making it possible to count 16384 clock ticks, then 64 conversions and their summation can be carried out in this manner.

The method of reading a pixel according to the invention can include, as in the prior art, two conversion phases, the first to measure a reinitialization level of the storage node, the second to measure a useful level corresponding to the quantity of light received by the pixel, with the aim of thereafter subtracting the two measurement results, thus removing the noise associated with the capacitive storage node of the pixel. For each conversion phase, a decision phase which makes it possible to select the mode of conversion is then associated.

In practice, the reinitialization level of the storage node represents by definition a low level of light. Thus, according to the invention the phase of converting the reinitialization level will thus use the second mode of conversion, with multiple conversions by comparison with a ramp of reduced duration $d_r$.

The phase of converting the useful level will be performed according to the first mode of conversion if it corresponds to a high level of light, and according to the second mode of conversion in the converse case.

To perform the subtraction of the two results, these results must be homogeneous.

Figure 5:
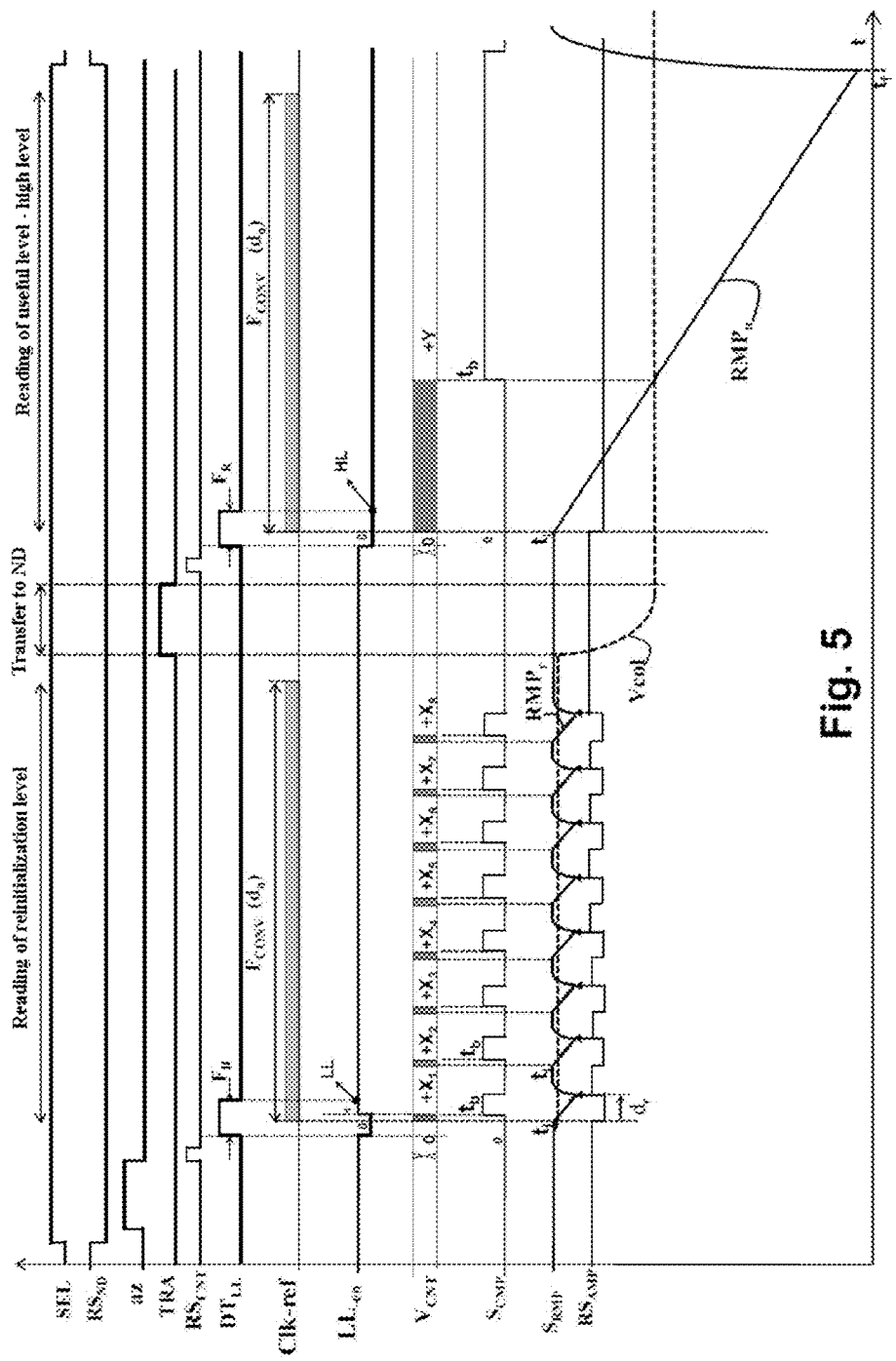
FIG. 5 is a timechart illustrating a method of reading according to the invention, comprising the reading of a reinitialization level and of the useful level of a pixel, in the case where this useful level corresponds to a high light level.
Figure 6:
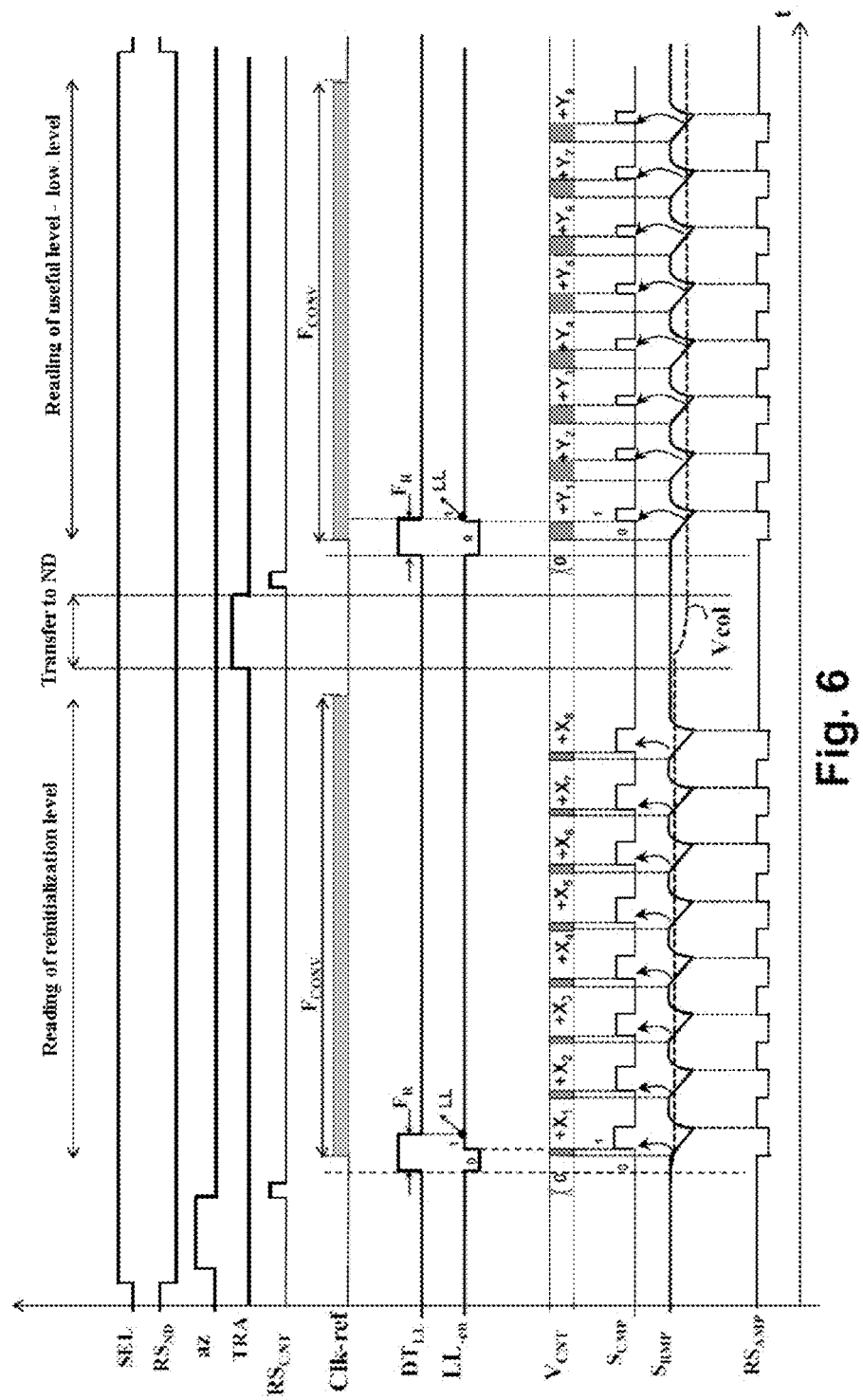
FIG. 6 is a timechart illustrating a method of reading according to the invention, comprising the reading of a reinitialization level and of the useful level of a pixel, in the case where this useful level corresponds to a low light level.

FIGS. 5 and 6 respectively illustrate what then happens when the useful level represents a low level of light (FIG. 5) or a high level (FIG. 6).

In the case represented in FIG. 5, the two conversions are both carried out according to the second mode of conversion, with n conversions of reduced duration and accumulation of the n results, as described in conjunction with FIG. 3. Provision may be made for a storage of the two accumulated results, followed by a subtraction by the digital processing circuit. A division by n can be carried out thereafter.

In the case represented in FIG. 6, the useful level is carried out according to the first, conventional, mode of conversion. The subtraction of the result corresponding to the reinitialization level can be done only after division by n of the result stored for the reinitialization level.

Provision is then made for the state of the logic signal $LL_{-en}$ to be stored with the final result of each conversion. Thus, if $LL_{-en}$ is set to "1" for the useful level, the circuit DSP will carry out the subtraction of the two stored results on completion of each nominal conversion window. If $LL_{-en}$ is set to "0" for the useful level, the circuit DSP will firstly carry out the division by k of the result corresponding to the measurement of the reinitialization level, and then the subtraction of the two results.

It will be noted that the method of reading which has just been described can also be applied when a single counter is used for all the columns. In this case, for each of the n conversions, provision must be made to store the value of the counter at the start and at the end of counting. Thereafter it is the circuit DSP which determines the counting value for each of the n conversions, by subtraction, and then the average value of these n conversions.

Figure 7:
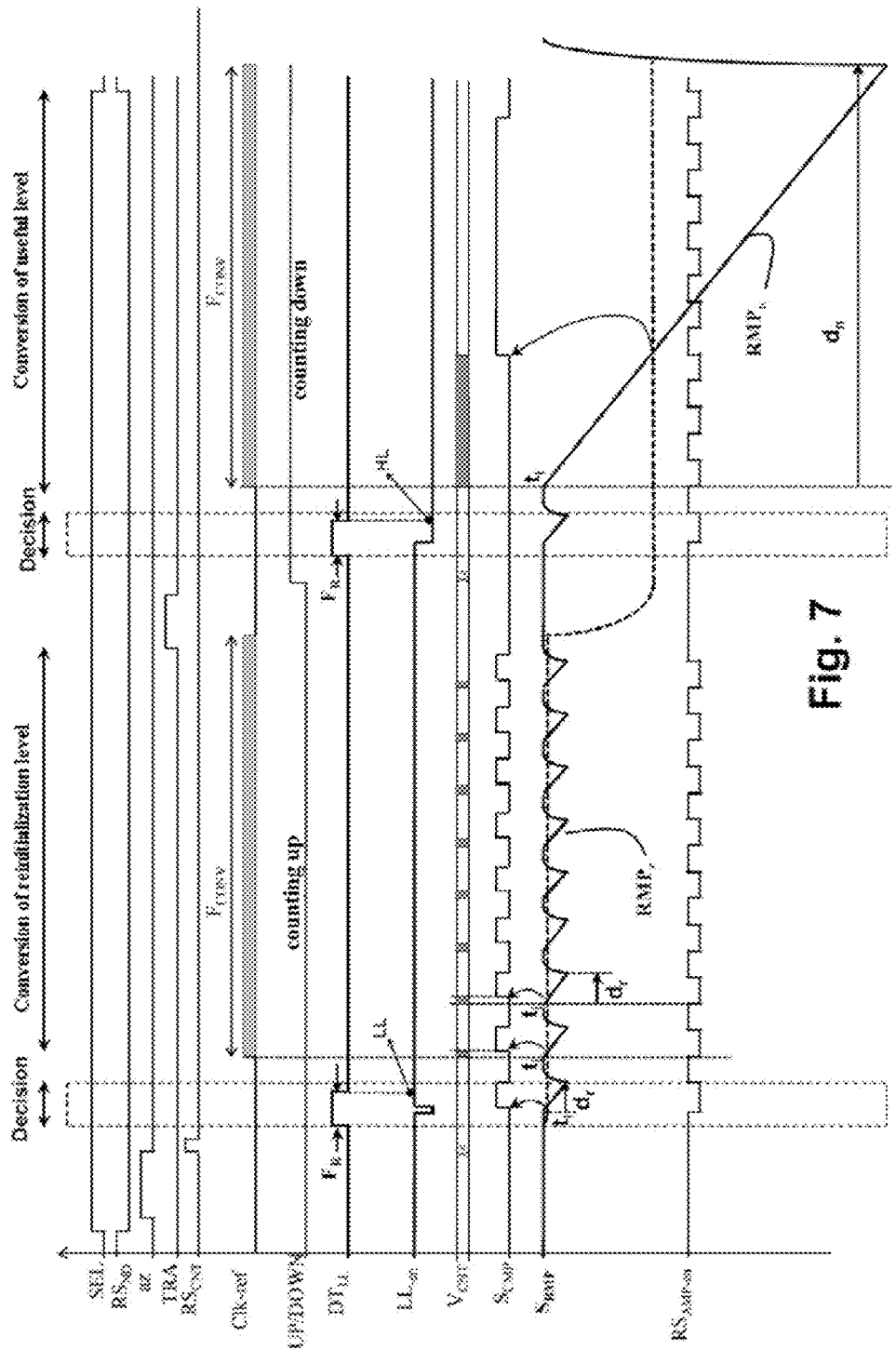
FIG. 7 illustrates a variant of the method of reading according to the invention, according to which the deciding of the mode of conversion to be applied is performed before the analogue-digital conversion.

FIG. 7 illustrates a variant of the method of reading according to the invention, in which the decision phase is no longer concomitant with the conversion, but prior to this phase.

It uses as previously a comparison with a ramp of reduced duration, and the copying over of the output $S_{CMP}$ of the comparator, from the instant of ramp start or slightly before, until the end of the ramp. The end of this ramp marks the start of the nominal conversion time window, for the level to be converted. Thus the copyover window and the conversion window do not overlap, the first terminating at the instant $t_r$ before the second starts.

It will be noted that during this decision phase, that is to say over the duration of the copyover window $F_R$, the counter is not active. It is activated only during the nominal conversion time window $F_{CONV}$.

The decision phase may advantageously use as ramp, the nominal ramp used for the conversion phases, which is then interrupted on expiry of the duration $d_r$ after the instant $t_i$ of ramp start according to the same mechanism for reinitializing the amplifier AMP already described. This is what is illustrated.

But it could use its own ramp, notably a ramp having a higher slope, and therefore a duration which may be shorter, allowing a faster decision. Indeed, in this decision phase, it is not sought to convert with precision, but only to determine the mode of conversion to be used thereafter. This specific ramp could be provided on the basis of the ramp generator RMP common to the columns, by using another large-gain amplifier and associated signals for controlling initialization and sampling.

This variant of the method of reading with a decision phase prior to the conversion phase, makes it possible to carry out directly in the counter CNT, the subtraction between the result obtained by the conversion of the reinitialization level and that obtained by the conversion of the useful level. The counter is used in counting mode for the first conversion (reinitialization level), and then in countdown mode for the second conversion (useful level), with for the latter a parametrization of the countdown pace, of 1 by 1 or of n by n, as a function of the state of the signal $LL_{-en}$ during the window $F_{CONV}$.

Indeed, if the useful level represents a low light level, the signal $LL_{-en}$ is set to 1. The useful level will be converted according to the same multiple-conversion mode as the reinitialization level. The results are homogeneous. The counter is then parametrized to count down 1 by 1.

But if the useful level represents a high light level, the signal $LL_{-en}$ is set to 0. The useful level will be converted according to the conventional mode with single counting. The results are not homogeneous. The counter is then parametrized to count down n by n.

Carrying out the subtraction of the results in the counter by counting and then counting down, assumes that there is a counter per column; this also assumes that the content of the counter is not reinitialized between the first conversion phase and the second conversion phase: stated otherwise that the countdown operates on the result of the counting.

The implementation of this variant thus requires a few additional or modified control and sequencing signals, notably to correctly parametrize the counter for each conversion phase. This entails notably the UP/DOWN signal parametrizing the counter in counting mode for the first conversion phase and in countdown mode for the second conversion phase (useful level) and signals making it possible to configure the counting pace of the counter: always 1 by 1 in counting mode; and 1 by 1 or n by n in the countdown mode, as a function of the state of the signal $LL_{-en}$. This may for example be carried out by parametrization of a register of the counter provided for this purpose.

The invention claimed is:

1. A method for reading a pixel in a matrix image sensor, the pixel providing on a column conductor a voltage level representing a light level received by the pixel, and the method of reading comprising an analogue-digital conversion by means of a ramp-type converter comprising a comparison of the voltage level received from the column conductor with a linear analogue voltage ramp by means of a comparator, and a counting of clock pulses between an instant of ramp start and an instant of toggling of the output of the comparator, wherein the method of reading comprises a phase of detecting the toggling of the output of the comparator after a predetermined time after the instant of ramp start, to discriminate between a high light level, if the output has not toggled, or a low light level, if the output has toggled and convert the voltage level in accordance with respectively a first or a second mode of conversion where the first mode of conversion comprises a single counting by the counter in the course of a nominal conversion time window with the aid of a ramp of nominal duration allowing the conversion of a high light level, the second mode of conversion comprises the establishment of n successive ramps of reduced duration over the duration of the nominal conversion time window, with for each ramp, a counting by the counter between the start of the ramp and the toggling of the output of the comparator, and a summation of the n counting results, where n is an integer greater than 1.

2. The method of claim 1, in which the detection step is carried out in parallel with the analogue-digital conversion of the column voltage level in the nominal conversion time window and starts with the voltage ramp of nominal duration, and in that, should the output of the comparator toggle before the end of the decision phase, the voltage ramp of nominal duration is interrupted after the reduced duration and constitutes the first of the n successive ramps.

3. The method of claim 2, using a counter specific to each column of the matrix of pixels, wherein the second mode of conversion, the counting commences, after resetting to zero, with the first of the n successive ramps of reduced duration, and resumes without resetting to zero with each of the n−1 following ramps of reduced duration, the counter providing as output the result of the summation by accumulation of the n countings.

4. The method of claim 3, in which the pixel comprises a charge storage node which is reinitialized before receiving the charge engendered by the light, the method comprising a first conversion of a reinitialization level, a second conversion of a useful level representative of the light level received by the pixel and a subtraction of the results of the two conversions, wherein the case of a useful level corresponding to a high light level, the result of the conversion of the reinitialization level which is carried out according to the second mode, is divided by n before subtraction of the result of the conversion of the useful level.

5. The method of claim 1, in which the detection phase is carried out before the analogue-digital conversion, and comprises a comparison of the voltage level with the nominal voltage duration ramp and the detection of the state of the output of the comparator at a predetermined instant after the instant of ramp start.

6. The method of claim 5, in which the pixel comprises a charge storage node which is reinitialized before receiving the charge engendered by the light, the method comprising a first conversion of a reinitialization level, a second conversion of a useful level representative of the light level received by the pixel and a subtraction of the results of the two conversions, wherein the subtraction is carried out directly in an up-counter/down-counter specific to each column of the matrix of pixels, by controlling the counter
for the first conversion, of the reinitialization level, into 1 by 1 counting mode and then
for the second conversion, of the useful level, into countdown mode without resetting to zero, and with a 1 by 1 or n by n countdown as a function of the result of the corresponding decision phase.

7. The method of claim 1, in which the voltage ramps all have one and the same starting level equal to the voltage level of the column conductor during a phase of reinitializing the pixel.

8. A matrix image sensor comprising a matrix of pixels organized into rows and columns, the pixels of one and the same column being linked to a column conductor linked to a reading circuit, a selected pixel for reading providing on the column conductor, a voltage level representing a light level received by the pixel, and the reading circuit comprising a ramp-type analogue-digital converter comprising a comparator for comparing the voltage level received from the column conductor with a linear analogue voltage ramp, and a counter of clock pulses which counts between an instant of ramp start and an instant of toggling of the output of the comparator, wherein the reading circuit comprises a circuit for selecting a first mode of conversion or a second mode of selection, depending on whether the output of the comparator has not toggled, or has toggled, after a predetermined time after the instant of ramp start, where
the first mode of conversion comprises a single counting by the counter in the course of a nominal conversion time window with the aid of a ramp of nominal duration allowing the conversion of a high light level, the second mode of conversion comprises the establishment of n successive ramps of reduced duration over the duration of the nominal conversion time window, with for each ramp, a counting by the counter between the start of the ramp and the toggling of the output of the comparator, and a summation of the n counting results, where n is an integer greater than 1.

* * * * *